United States Patent
Seyyedy et al.

(10) Patent No.: US 7,405,966 B2
(45) Date of Patent: Jul. 29, 2008

(54) MAGNETIC TUNNELING JUNCTION ANTIFUSE DEVICE

(75) Inventors: Mirmajid Seyyedy, Boise, ID (US); Mark E. Tuttle, Boise, ID (US); Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/626,256

(22) Filed: Jan. 23, 2007

(65) Prior Publication Data

US 2007/0127303 A1 Jun. 7, 2007

Related U.S. Application Data

(60) Continuation of application No. 11/123,916, filed on May 6, 2005, now Pat. No. 7,176,065, which is a division of application No. 10/820,415, filed on Apr. 8, 2004, now Pat. No. 6,919,613, which is a division of application No. 10/225,570, filed on Aug. 20, 2002, now Pat. No. 6,751,149.

(60) Provisional application No. 60/367,673, filed on Mar. 22, 2002.

(51) Int. Cl.
*G11C 11/15* (2006.01)

(52) U.S. Cl. ............... 365/173; 365/171; 365/97; 365/209

(58) Field of Classification Search ............ 365/171, 365/173, 97, 209, 189.01
See application file for complete search history.

(56) References Cited

U.S. PATENT DOCUMENTS

| | | | |
|---|---|---|---|
| 6,108,260 A | 8/2000 | Casper | |
| 6,349,054 B1 | 2/2002 | Hidaka | |
| 6,473,337 B1 * | 10/2002 | Tran et al. | 365/173 |
| 6,483,734 B1 * | 11/2002 | Sharma et al. | 365/97 |
| 6,501,679 B2 | 12/2002 | Hidaka | |
| 6,504,753 B1 * | 1/2003 | Scheuerlein et al. | 365/175 |
| 6,545,898 B1 * | 4/2003 | Scheuerlein | 365/94 |
| 6,567,287 B2 | 5/2003 | Scheuerlein | |
| 6,618,295 B2 * | 9/2003 | Scheuerlein | 365/189.09 |
| 6,630,703 B2 | 10/2003 | Scheler et al. | |
| 6,751,149 B2 * | 6/2004 | Seyyedy et al. | 365/225.7 |
| 6,919,613 B2 * | 7/2005 | Seyyedy et al. | 257/530 |
| 7,176,065 B2 * | 2/2007 | Seyyedy et al. | 438/131 |
| 7,180,772 B2 * | 2/2007 | Rinerson et al. | 365/171 |
| 2002/0080646 A1 | 6/2002 | Hidaka | |
| 2002/0136047 A1 | 9/2002 | Scheuerlein | |
| 2004/0027854 A1 | 2/2004 | Iwata et al. | |

\* cited by examiner

*Primary Examiner*—Viet Q Nguyen
(74) *Attorney, Agent, or Firm*—Knobbe, Martens, Olson & Bear LLP (57) ABSTRACT

An MRAM device having a plurality of MRAM cells formed of a fixed magnetic layer, a second soft magnetic layer and a dielectric layer interposed between the fixed magnetic layer and the soft magnetic layer. The MRAM cells are all formed simultaneously and at least some of the MRAM cells are designed to function as antifuse devices whereby the application of a selected electrical potential can short the antifuse device to thereby affect the functionality of the MRAM device.

9 Claims, 5 Drawing Sheets

MAGNETIC TUNNELING JUNCTION ANTIFUSE DEVICE

RELATED APPLICATIONS

This application is a continuation application of U.S. application Ser. No. 11/123,916 filed May 6, 2005, which is a divisional application of U.S. application Ser. No. 10/820,415 filed Apr. 8, 2004 (now U.S. Pat. No. 6,919,613), which is a divisional application of U.S. Pat. No. 6,751,149 filed Aug. 20, 2002, which claims the benefit of U.S. Provisional Application No. 60/367,673 filed on Mar. 22, 2002, the entirety of each of which is hereby incorporated by reference.

BACKGROUND OF THE INVENTION

1. Field of the Invention

The present invention relates to semiconductor processing technology and, in particular, concerns a device and a fabrication process whereby a Magnetoresistive Random Access Memory (MRAM) structure can be used as a selectively programmable antifuse device.

2. Description of the Related Art

Since the introduction of the digital computer, electronic storage devices have been a vital resource for the retention of binary data. Conventional semiconductor electronic storage devices incorporate capacitor type structures, which are referred to as Dynamic Random Access Memory (DRAM), that temporarily store binary data based on the charged state of a capacitor. This type of semiconductor Random Access Memory (RAM) requires a continuous supply of power and a periodic charge refresh to maintain a particular defined logic-state. As a result, semiconductor RAM is considered volatile memory due to the fact that data can be lost with the loss of power. For many applications, it may be desirable to replace traditional volatile memory with an improved solid-state non-volatile memory device. This need has fueled research and development in the area of non-volatile memory storage devices while still maintaining a high-density fabrication process and technique. The increased demand for a more sophisticated, efficient, and non-volatile data retention technique has driven the development of Magnetoresistive Random Access Memory (MRAM) devices.

MRAM is a developing technology that offers the advantages of non-volatility and high-density fabrication. MRAM structures employ the spin property of electrons within layers of magnetic material to read the memory storage logic states. Binary logic states typically take advantage of a resistance differential to distinguish between "on" and "off" states. Resistance is a measure of the inability of an electrical current to flow through a specific material, whereas current is the actual flow of charge carriers through a material. If a material has a high resistance, then the ability of electrons to flow through the material is inhibited. Conversely, a low resistive material tends to allow a higher degree of current to flow.

MRAM structures take advantage of this resistivity concept by manipulating the alignments of spin states within multiple layers of material to increase or decrease the resistance of a material. Magnetic Tunnel Junctions (MTJ), for example, are electronic structures that exhibit a high resistance across the tunneling dielectric structure. MTJ based MRAM devices incorporate at least two thin layers of magnetic material separated by an insulating tunnel barrier. The magnetic and insulating layers are fabricated on the substrate. The MRAM magnetic layers consist of a magnetic pinned layer and a magnetic sense layer. The selective programmability of the sense layer enables the MRAM structure to act as a logic state device, which stores binary data as directions of net magnetization vectors in the metallic MTJ layers. Current flow through two orthogonal conductive traces induces a magnetic moment in a parallel or anti-parallel configuration between the pinned layer and the sense layer.

MRAM structures employ the nature of spin dependent variable resistance when used to define logic states wherein the high and low resistivity states represent a logical "1" or "0," respectively. The corresponding parallel and antiparallel magnetization states reflect and represent two different resistances. The overall MTJ resistance has minimum and maximum values when the net magnetization vectors of the two individual magnetic layers point in substantially the same (parallel) and opposite (antiparallel) directions, respectively. When these materials are layered in a particular fashion, they exhibit a variable vertical electrical resistance depending on the magnetization state of the individual layers.

Due to the physical arrangements of MTJ layers, MRAM structures may be fabricated using similar integration techniques as conventional DRAM. In addition, integrated circuits often implement permanent programmable electrical connections between circuit nodes. One type of permanent programmable electrical connections is referred to as an antifuse link. Field Programmable Gate Array (FPGA) devices may employ antifuse structures for their high-density fabrication ability and efficient ease of programmability. Application Specific Integrated Circuits (ASICs) may make use of antifuses for effective system logic implementation on a single chip.

A fuse is often used in an electrical circuit to inhibit the excessive flow of electrons by creating a permanent open circuit at the fuse. When a fuse is "blown," the permanently open circuit stops the flow of charge carriers through the electrical circuit at the fuse. In contrast, an antifuse is often used in an electrical circuit to allow an open flow of charge carriers by creating a permanent short circuit at the fuse. When an antifuse is "blown," a permanent short is created at the antifuse.

Conventional antifuse devices in a DRAM array may be fabricated with a structure similar to that of a capacitor, i.e., a dielectric layer separated by two conductive electrical terminals. Initially, an antifuse device is fabricated in the "off" state, which presents a high resistance between antifuse terminals. Conversely, the "on" state represents a lower resistive connection between antifuse terminals. To program an antifuse "on" state, a large programming voltage, usually between 7 and 9 volts, may be applied across the antifuse terminals, which causes breakdown of the interposed dielectric and forms a short circuit between the antifuse terminals. However, the short circuit produced by high voltage is unreliable. Accordingly, alternative methods, such as laser fusing is generally employed to program antifuses in DRAM circuits. Though more reliable, such processes are cumbersome, particularly where they depend upon the use of different materials on structures from adjacent cell capacitors, which may require additional processing steps during fabrication. An even larger voltage could be used to better break down the dielectric material, but such a voltage is more likely to cause damage to neighboring circuitry.

Hence, the use of conventional antifuse devices in MRAM types of devices may be expensive in terms of production costs and in terms of loss of available space for other circuit components. Additionally, the use of conventional antifuse devices may potentially cause damage to neighboring circuit components due to the relatively high programming voltage needed to change the antifuse from a non-conducting state to a conducting state. Thus, there exists a need for an improved method of manufacturing antifuse devices that do not consume as much substrate space and do not add additional processing steps to the process of fabricating integrated circuitry. More particularly, there is a need for an antifuse device that is better suited for fabrication with MRAM type devices that may be programmed in a safer manner.

SUMMARY OF THE INVENTION

The aforementioned needs are satisfied by the present invention which, in one aspect, is comprised of a memory device. The memory device includes a substrate having a first surface and a first plurality of magnetic tunnel junction (MTJ) devices formed on the substrate. The first plurality of MTJ devices are logically interconnected to form a memory array, wherein logical data can be stored by selective magnetization of individual MTJ devices of the array. The memory device further includes at least one antifuse MTJ device formed on the substrate, wherein the antifuse MTJ device is electrically interconnected to the memory device. Selective application of a "high" voltage to the antifuse device blows the tunneling dielectric. Advantageously, the process allows for the simultaneous fabrication of antifuse devices along with the fabrication of the MTJ devices forming the memory array.

In another aspect, the present invention comprises an antifuse device for an integrated circuit formed on a substrate. The antifuse device comprises a first layer of magnetic material formed on an exposed surface of the substrate, a second layer of magnetic material positioned on top of the first layer and a dielectric layer interposed between the first layer and the second layer wherein the first layer, the second layer and the dielectric layer form a magnetic tunnel junction device. In this aspect, the device further includes a logic circuit that is selectable so as to interconnect the first layer to a first electrical potential such that the first and second layers of magnetic material are shorted together when the logic circuit is selected. The use of the magnetic layers and the dielectric layer results in an antifuse device that can be shorted at a relatively low voltage, e.g., 1.8 volts.

In yet another aspect, the present invention comprises a method of forming a magnetic random access memory array device comprising simultaneously forming a plurality of first layers of magnetic material on a semiconductor substrate, wherein at least one of the first layers of magnetic material is for an antifuse device. The method further comprises simultaneously forming a plurality of dielectric layers on the plurality of first layers of magnetic material wherein at least one of the dielectric layers is for the antifuse device and also simultaneously forming a plurality of second layers of magnetic material on the plurality of dielectric layers wherein at least one of the second layers of magnetic material is for the antifuse device. The method further comprises electrically interconnecting the antifuse device to a source of electrical potential such that application of the electrical potential results in the antifuse device being shorted.

These and other objects and advantages of the present invention will become more fully apparent from the following description taken in conjunction with the accompanying drawings.

DETAILED DESCRIPTION OF THE PREFERRED EMBODIMENT

Reference will now be made to the drawings wherein like numerals refer to like parts throughout.

Figure 1A:
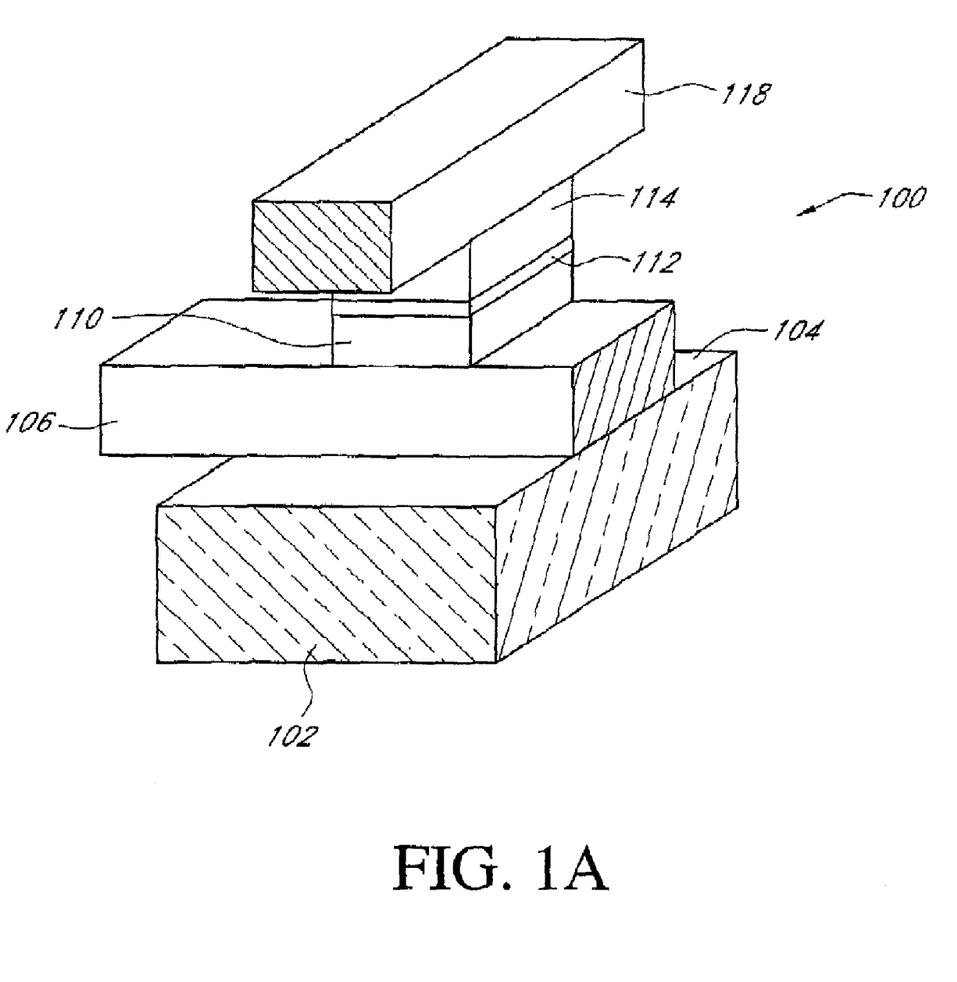
FIG. 1A is a perspective view of a basic MTJ-based MRAM cell, serving as an antifuse device in accordance with an embodiment of the present invention.

FIG. 1 shows a Magnetic Tunneling Junction (MTJ) antifuse device 100, wherein the antifuse 100 is formed on a substrate 102. The illustrated substrate 102 comprises a conventional silicon wafer, but can more generally encompass structures comprising semiconductor material, including, but not limited to, bulk semiconductor materials such as a semiconductor wafer (either alone or in assemblies comprising other materials thereon), and semiconductive material layers (either alone or in assemblies comprising other materials). Additionally, the term "substrate" may also encompass any supporting structures, including, but not limited to, the semiconductive substrates described above. Furthermore, when reference is made to substrate within the following description, previous process steps may have been utilized to form regions, structures or junctions in or on its base semiconductor structure or foundation.

Formed on the first surface 104 is a first conductive trace 106 that serves as a bottom electrode for the antifuse 100 to ground, wherein ground refers to a voltage potential of zero. The first conductive trace 106 is formed of a conductive material, such as aluminum, an aluminum alloy, or doped polysilicon, which is deposited by techniques known in the art. The first conductive trace 106 interconnects the base of the antifuse 100 to a contact point for a ground link as will be described in greater detail herein below. The first conductive trace 106 thereby serves as a short to ground. It should be appreciated that the first conductive trace 106 may be formed using copper and a damascene process in a manner as is generally known in the art.

A first magnetic layer 110 is formed over the conductive trace 106. The first magnetic layer 110 comprises, in this embodiment, a hard magnetic material, such as NiFe that is approximately 200 Å thick. The "hard" magnetic material is so called because its orientation is maintained in the face of the relatively low magnetic fields used during operating. MTJ stack layers, including the first magnetic layer 110, are formed in a manner well known in the art by deposition techniques such as sputter-deposition, physical vapor deposition, or ion-beam deposition. In one aspect, the pinned layer 110 can be magnetized in a first fixed direction and acts as a first reference point for the net directional magnetization vectors of the antifuse 100. Accordingly, the first magnetic layer 110 is also referred to herein as the "pinned" layer 110. Positioning the pinned layer 110 on the conductive trace surface 108 results in a direct conductive link between the antifuse 100 and ground as will be described in greater detail herein below.

A thin dielectric layer 112 is formed on an upper surface of the pinned layer 110, wherein the thin dielectric layer 112, in this embodiment, comprises a layer of $Al_2O_3$ that is approximately 10 to 15 Angstroms (Å) thick. Various fabrication techniques utilized for producing the tunneling dielectric layer 112 include depositing a metallic aluminum layer in a manner well known in the art. Then, oxidation of the aluminum layer is achieved by one of several different methods: plasma oxidation, oxidation by air, and ion-beam oxidation, wherein all are derived in a manner well known in the art. In one aspect, the thin dielectric layer 112 acts as a tunneling conduit for excited electrons to flow through without causing dielectric breakdown at low voltages as will be described in greater detail herein below.

A second magnetic layer 114 is formed on an upper surface of the tunneling dielectric layer 112. The second magnetic layer 114 comprises, in this embodiment, a "soft" magnetic material, such as NiFe that is approximately 50 Å thick. The soft magnetic material is more readily re-oriented by relatively weak magnetic fields, and so serves as the "sense" layer 114 in the illustrated MTJ stack. MTJ stack layers, including the sense layer 114, are formed in a manner well known in the art by deposition techniques such as sputter-deposition, physical vapor deposition, and ion-beam deposition. In one aspect, the soft layer 114 is magnetized in a first fixed direction or a second direction, depending on an applied magnetic field, and provides a second reference point for the net directional magnetization vectors of the antifuse 100.

A second conductive trace 118 is formed over the stack, serving as the upper electrode for the antifuse 100 and an interconnect to a contact point for an external voltage supply and also to a logic circuit in the manner that will be described in greater detail below. The second conductive trace 118 is formed of a conductive material, preferably metal, such as aluminum, an aluminum alloy, or doped polysilicon, which may be deposited by known techniques in the art. The second conductive trace 118 thus extends from the top of the antifuse 100 to a contact point for a voltage supply link. It should be appreciated that the second conductive trace 118 may also comprise copper.

Thus, FIG. 1A illustrates the most basic configuration of a magnetic tunnel junction (MTJ) magnetic random access memory (MRAM) cell. There are essentially two conducting layers that are separated by a very thin dielectric layer. In other arrangements, the skilled artisan will appreciate that the order of the layers can be reversed, such that the sense layer is first formed and the pinned layer is formed over the tunnel dielectric. Furthermore, practical applications of the MTJ-based MRAM will include other layers for specialized functions.

Applicants have found that application of a voltage between the two conducting layers can result in the thin dielectric layer breaking down thereby greatly reducing the resistance of the antifuse structure. Dielectric breakdown of the dielectric layer 112 can be observed, in this particular embodiment, with applied voltage potentials greater than 1 volt to the conductive trace 118 of the antifuse 100. Significant dielectric breakdown occurs at applied voltage potentials of 1.8 volts or greater, whereby significant dielectric breakdown of dielectric material causes a short between layers of metallic materials. In one embodiment, application of 1.8 volts reduces the resistance across the antifuse device 100 from >1 MΩ to <1 kΩ.

Figure 1B:
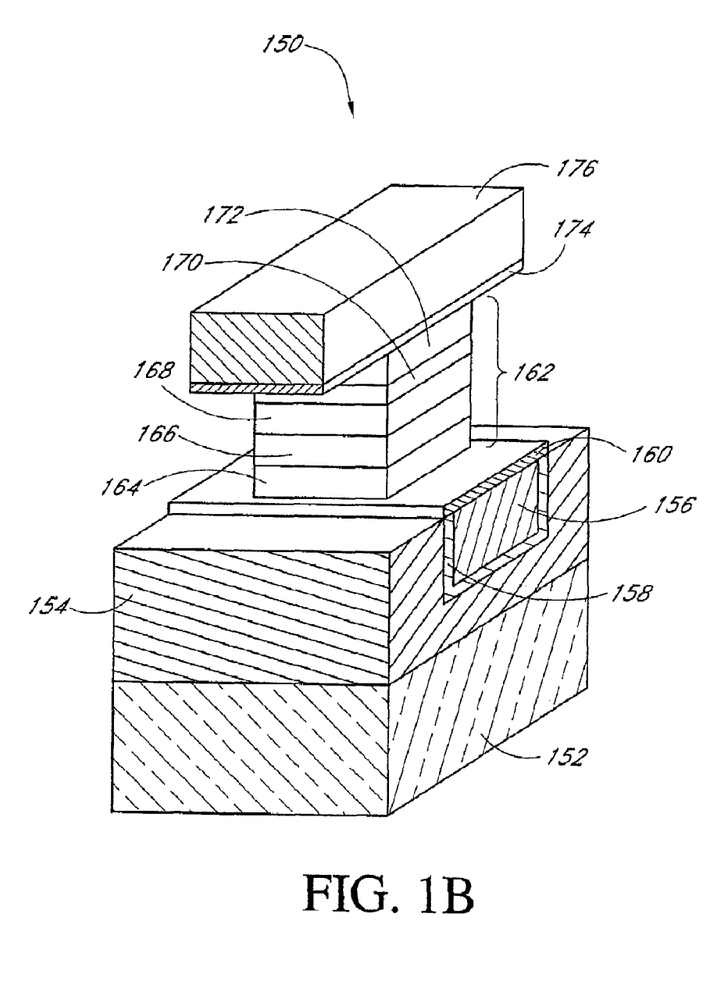
FIG. 1B is a schematic cross-section of a practical, more complicated MRAM structure that serves as an antifuse device, in accordance with another embodiment of the present invention.

FIG. 1B illustrates a practical, more complicated MRAM structure 150 that serves as an antifuse device, in accordance with another embodiment of the present invention. The MRAM structure 150 is formed on a substrate 152 that is similar in scope to the substrate 102 as referenced by FIG. 1A. For illustrative purposes, the substrate 152 comprises a Silicon wafer that is fabricated in a generally known manner. An insulating layer 154 comprising, in one embodiment, silicon-dioxide ($SiO_2$), may be formed on the substrate 152 using a CVD process.

A lower conductive trace 156, comprising, in one embodiment, copper that is approximately 2000 Å thick, may be formed in the insulator layer 154 using a generally known damascene process, wherein the lower conductive trace 156 provides a first conductive contact to the MRAM structure 150. In one aspect, copper is a desirable conductor to use in metalization for integrated circuits due to its low resistivity and electromigration resistance.

To provide protection against copper diffusion of the lower conductive trace 156, a barrier material may be used. A liner 158 is formed using known deposition techniques prior to depositing the lower conductive trace 156, which may be deposited using CVD, sputtering deposition, or electroplating. Once deposited, the second conductive trace 156 may then be planarized using CMP to produce a substantially uniform surface across the silicon-dioxide layer 154. A cap 160 may then be formed on the lower conductive trace 156 and the liner 158 using known masking and deposition techniques. The liner 158 and the cap 160 serve as a diffusion barrier and may comprise barrier material, such as Ta, TaN, TiN, and WN, that comprises a thickness of approximately 50 Å. In an alternative embodiment, the barrier cap 160 may comprise a thickness between approximately 50 and 500 Å without departing from the scope of the present invention. The barrier material may be selected to provide strong mechanical bonding between the lower conductive trace and the silicon-dioxide layer 154.

A magnetic memory stack 162 may be formed on the cap 160 using known masking and deposition techniques, such as CVD. In one embodiment, the magnetic memory stack 162 may comprise a seed layer 164, a pinning layer 166, a pinned layer 168, a tunneling layer 170, and a sense layer 172. It should be appreciated that the sequence in which the magnetic memory stack 162 layers are positioned may be altered by one skilled in the art without departing from the scope of the present invention.

The seed layer 164 comprises, in one embodiment, nickel-iron (NiFe) that is approximately 30 Å thick and is formed over the cap 160. The pinning layer 166 comprises, in one embodiment, iridium-manganese (IrMn) that is approximately 100 Å thick and is formed over the seed layer 164. IrMN is a known anti-ferromagnetic material that may be used to pin the magnetic polarization of the pinned layer 168. The pinned layer 168 comprises, in one embodiment, cobalt-iron (CoFe) that is approximately 60 Å thick and is formed over the pinning layer 166. In one aspect, the pinned layer 168 comprises similar scope and functionality of the first magnetic layer 110 as referenced by FIG. 1A, wherein the pinned layer 168 may be magnetized in a first fixed direction and provides a first reference point for the net directional magnetization vectors of the MRAM 150.

The tunneling layer 170 comprises, in one embodiment, aluminum-oxide ($Al_2O_3$) that is approximately 10 to 15 Å thick and serves as a tunneling conduit for excited electrons to flow through without causing dielectric breakdown at low voltages. It should be appreciated that the scope and functionality of the tunneling layer 170 comprises similar scope and functionality of the thin dielectric layer 112 with reference to FIG. 1A.

The sense layer 172 comprises, in one embodiment, NiFe that is approximately 40 Å thick. In one aspect, the sense layer 172 comprises similar scope and functionality of the second magnetic layer 114 as reference by FIG. 1A, wherein the sense layer 172 may be magnetized in a first fixed direction or a second direction, depending on an applied magnetic field, and provides a second reference point for the net directional magnetization vectors of the MRAM 150.

A barrier layer 174, comprising, in one embodiment, Ta, TaN, TiN, and WN that is approximately 50 Å thick, may be formed on the magnetic memory stack 162 using a known masking and deposition technique. The barrier layer 174 comprises similar scope and functionality as the liner 158 and cap 160. In an alternative embodiment, the barrier layer 174 may comprise a thickness between approximately 50 and 500 Å without departing from the scope of the present invention. Subsequent to the formation of the barrier layer 174, an upper electrode trace 176, comprising, in one embodiment copper that is approximately 2000 Å thick may be formed on the barrier layer 174 so as to provide a second conductive contact to the MRAM structure 150.

In an alternative embodiment, the magnetic memory stack 162 may be formed without the seed layer 164. In this particular embodiment, the pinning layer 166 comprises IrMn that is approximately 100 Å thick, and the pinned layer 168 comprises NiFe that is approximately 40 Å thick. In addition, the tunneling dielectric layer comprises $Al_2O_3$ that is approximately 10-15 Å thick, and the sense layer comprises NiFe that is approximately 40 Å thick. It should be appreciate that the sequence of these layers in the magnetic memory stack 162 may be positionally altered by one skilled in the art without departing from the scope of the present invention. For example, the order of the magnetic memory stack 162 layers may be reversed without detracting from the functionality of the magnetic memory stack 162. Furthermore, the Ta insulating and/or barrier layers may comprise a thickness of approximately 50-500 Å without departing from the scope of the present invention.

Whether utilizing the above-mentioned antifuse device 100 or the more practical MRAM structure 150, the Applicants have found that application of a voltage between the two conducting layers may result in the break down of the tunneling layers 112, 170 thereby greatly reducing the resistance of the either structure. As previously described, significant dielectric breakdown may occur at applied voltage potentials of 1.8 volts or greater, whereby significant dielectric breakdown of dielectric material including $Al_2O_3$ may cause a short between layers of conductive materials.

Figure 2A:
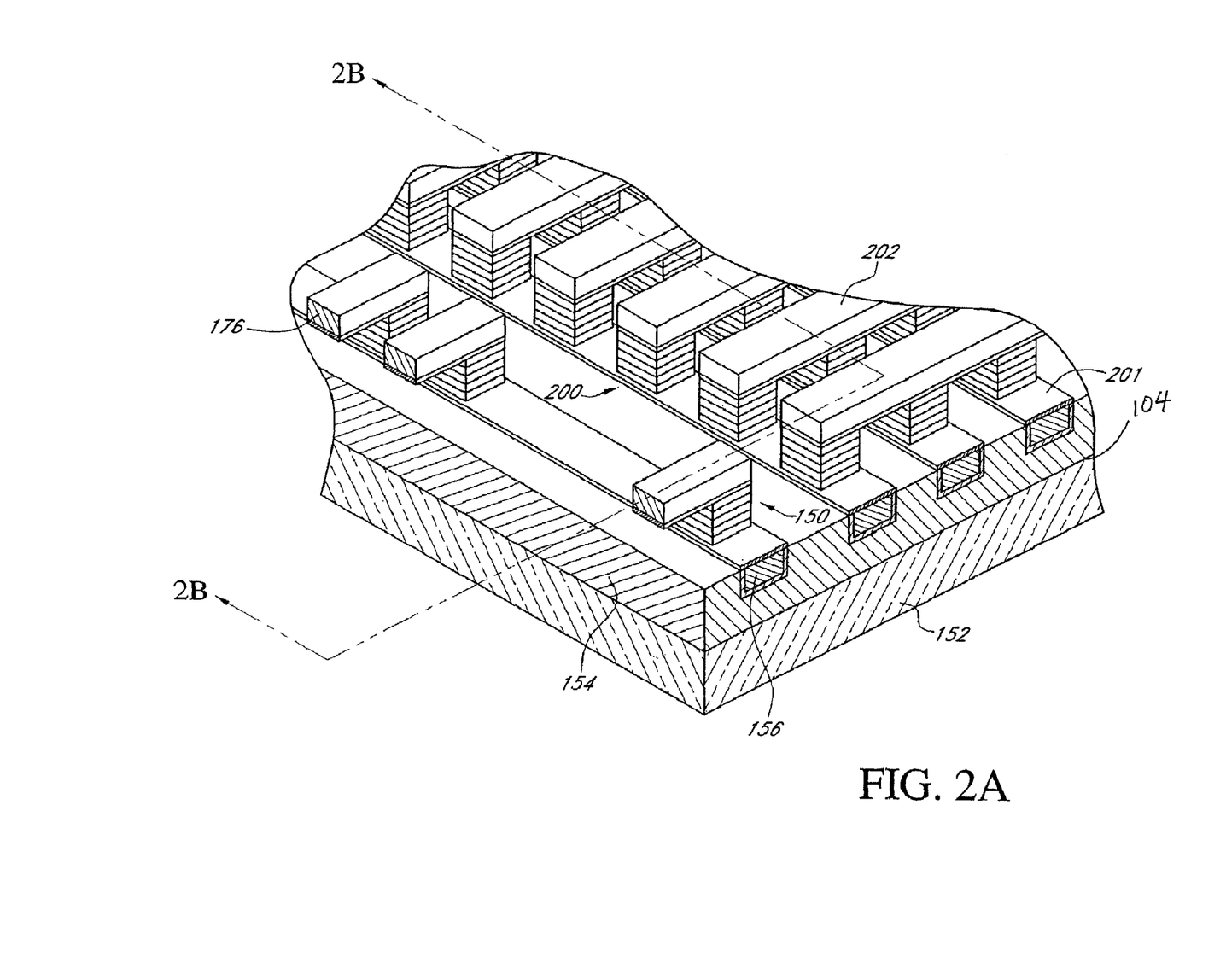
FIG. 2A is a schematic perspective view of MTJ MRAM integrated circuit comprising a plurality of MTJ MRAM memory cells formed on the substrate surface and a plurality of MTJ antifuses formed on the periphery of the substrate surface.

FIG. 2A schematically illustrates one embodiment of an MRAM device comprising a plurality of MRAM memory cells 200 and a plurality of antifuse devices 100. In this embodiment, the plurality of the memory cells 200 are configured in a cross-point configuration, wherein the formation process of the memory cells 200 utilize substantially identical MTJ materials and MTJ fabrication techniques as is used to form the antifuse devices 100. A plurality of antifuse devices 100, in this embodiment, are formed on the semiconductor substrate surface 102 at the periphery of the MRAM array 200 and are grouped in an array according to predetermined application specific configurations, wherein the configuration is not limited to FIG. 2A.

The array of MRAM devices 200 that form the memory array are programmed in a manner that is known in the art. Briefly, the conductive traces 201, 202, in this embodiment, act concurrently with each other as a mechanism to program the net directional magnetization vectors of memory cells 200 within the MRAM memory cell array, whereby the upper traces 202 may also be referred to as current sensing lines.

In addition, the traces 201, 202 may be formed of a conductive material, such as aluminum, an aluminum alloy, or doped polysilicon, which is preferably deposited by evaporation or sputter-deposition techniques in a manner well known in the art. The traces 201 are, in one embodiment, formed on the semiconductor substrate surface 104 and at the base of the memory cell 200 simultaneously with the formation of the conductive traces 106 of the antifuse devices 100, which are also formed on the semiconductor substrate surface 104.

Furthermore, the memory cells 200 are interposed between the traces 201, 202. Similarly, the antifuse devices 100 are interposed between the traces 106, 118. The traces 201 are formed on the lower surface of the memory cell 200 array and orthogonal to the conductive traces 202. Similarly, the trace 106 is formed on the lower surface of the antifuse device 100 array and are orthogonal to the conductive trace 118. The conductive traces 202 are formed on the upper surface of the memory cell 200. Similarly, the conductive traces 118 are formed on the upper surface of the antifuse 100.

It should be appreciated that the layout of the MRAM device, as illustrated in FIG. 2A, with the associated array of antifuse devices is simply exemplary of one possible MRAM device. The exact layout and configuration of MRAM devices and antifuse devices will, of course, vary depending upon the application and also upon the type of MRAM device that is being fabricated without departing from the spirit and scope of the present invention. Furthermore, reference to fabrication procedures and techniques will be further described in greater detail herein below.

It should also be appreciated that the fabrication of MTJ type structures or devices is a multistep process requiring numerous individual steps. Several basic manufacturing operations, including layering, patterning, and heating, are employed in specific sequential processing steps to construct the individual layers of the MTJ type structures on a substrate, such as the semiconductor substrate 102.

Figure 2B:
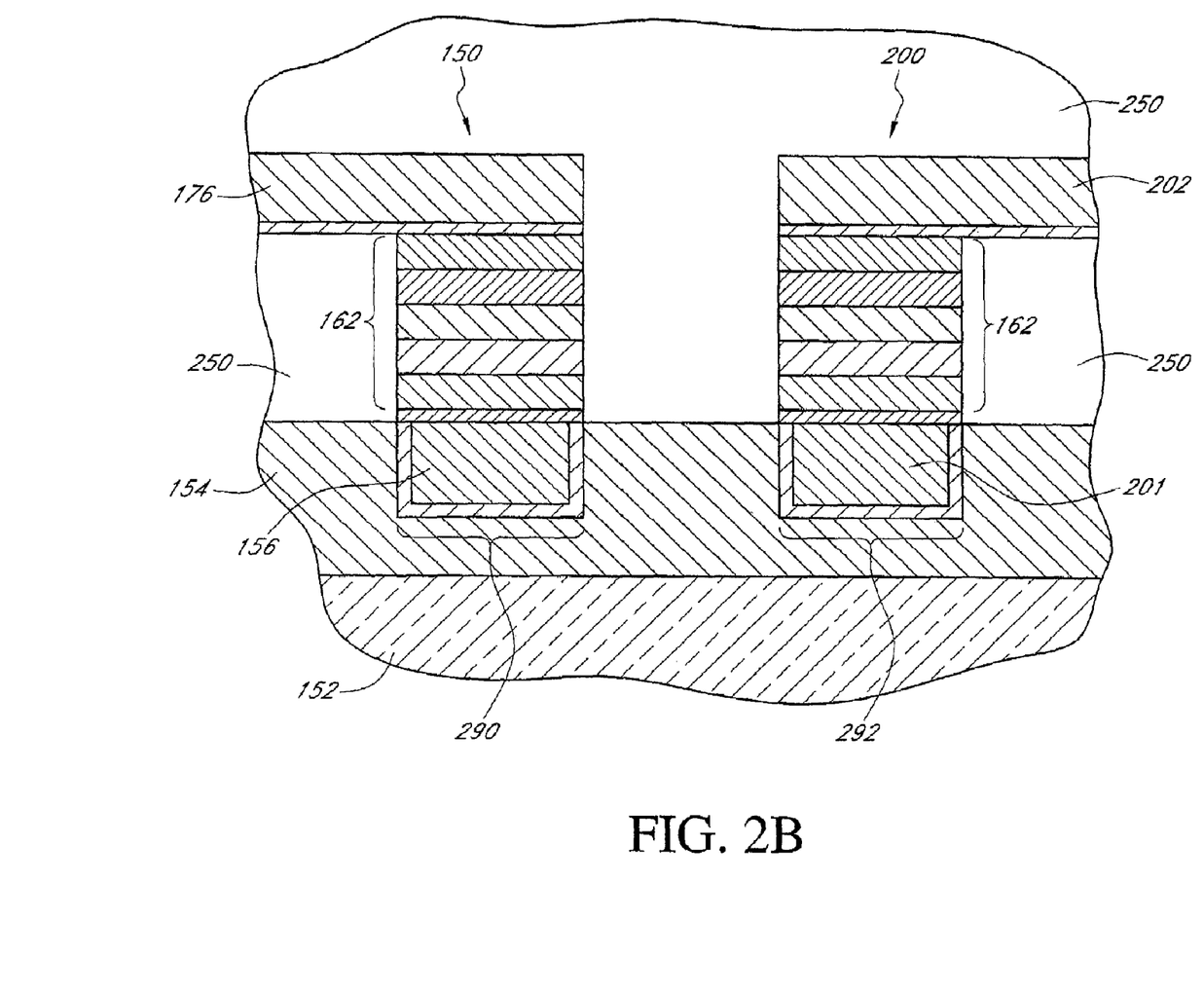
FIG. 2B is a cross-sectional view of an MTJ MRAM memory cell and an adjacent MTJ antifuse in the integrated circuit of FIG. 2A.

FIG. 2B illustrates one embodiment of multiple MTJ structures corresponding to the MRAM device as described in FIG. 2A. For clarity, FIG. 2B illustrates a cross-sectional view one of the antifuse devices 150 adjacent one of the memory cells 200 of the array shown in FIG. 2A. However, it will be appreciated that all of the antifuse devices 150 and all of the memory cells 200 may be formed simultaneously in the manner that is described below and that the drawing is not to scale—actually spaced. Specifically, an antifuse device 150 is formed on a first region 290 and the memory cell 200 is formed on a second region 292, wherein both regions 290 and 292 are located on the upper surface of the substrate 152.

The fabrication process of the integrated circuit, in one embodiment, begins with the simultaneous formation of the lower conductive traces 156, 201 on the substrate 152 using, in one embodiment, generally known metallization techniques as previously described with reference to FIGS. 1A, 1B. It should be appreciated that a generally known damascene deposition process may also be used to form the lower conductive traces 156, 201 without departing from the scope of the present invention, which may be subsequently followed by a chemical-mechanical polishing (CMP) process. In a typical damascene process, recessed wells are formed in the insulating layer 154. A conductive material, such as copper, is then deposited into the recessed wells. The CMP process is then used to planarize the first conductive traces 156, 201 to create a substantially uniform planar surface on the upper surface of the insulating layer 154.

Next, a contiguous layer comprising Tantalum (Ta) is then deposited on the first conductive traces 156, 201. Following, a contiguous layer comprising NiFe is deposited on the Ta layer. Subsequently, another contiguous layer comprising aluminum-oxide ($Al_2O_3$) may then be deposited on the NiFe layer. In one aspect, $Al_2O_3$ may be formed by depositing and oxidizing an aluminum material in a generally known manner. Still another contiguous layer comprising NiFe may then be deposited on the $Al_2O_3$ layer. Next, another contiguous layer comprising iridium-manganese (IrMn) is deposited on the $Al_2O_3$ layer. Still further, another contiguous layer comprising Ta is deposited on the IrMn layer. After deposition of the contiguous stacked layers, formation of the magnetic stack structures 162, as described with reference to FIG. 1B, may employ, in one embodiment, a photo-mask pattern and etch technique that creates cavities between the magnetic stack structures 162 so as to define the shape of the magnetic stack structures 162 as illustrated in FIG. 2A. It should be appreciated that these etched cavities may be filled with an insulating barrier material 250, such as silicon-dioxide.

Yet another contiguous layer comprising a conductive material is deposited on the Ta layer so as to simultaneously form the second conductive traces 176, 202. The formation of second conductive traces 176, 202 is achieved by first depositing a contiguous layer of conductive material, such as copper, and then employing a photo-mask pattern and etch technique that produces recessed channel openings in the contiguous layer for the deposition of the conductive material. It should be appreciated that a contiguous layer comprising an insulating material 250, such as an oxide based insulator, may be deposited on the second conductive traces 176, 202 such that the insulating layer 250 functions as a protective barrier layer that insulates the MTJ structures from various external contaminants.

It should be appreciated that the device 100 illustrated in FIG. 1A may be formed using a similar process. The less complicated structure of device 100 may require less processing steps, wherein the processing steps require the deposition and formation of the layers as described in FIG. 1A.

The advantage of simultaneously forming the antifuse 150 with the formation of the memory cell 200 is that unnecessary processing steps and redundant fabrication procedures will be, in this embodiment, reduced from the overall manufacturing process. Both the antifuse 150 and the memory cell 200 may be formed using the same photo-masks and photo-masking techniques for patterning, etching, and deposition procedures, whereby the sequential structural formation of the multiple MTJ structures on the substrate 152 occurs simultaneously. Also, in this embodiment, complicated substrate deposition techniques performed on the interior of the semiconductor substrate 152 are further reduced due to the simultaneous formation of MTJ structures directly adjacent to the semiconductor surface 152. By eliminating unnecessary fabrication steps and procedures, an overall reduction in manufacturing costs is achieved. This embodiment prevails in production cost reduction and efficiency.

Figure 3:
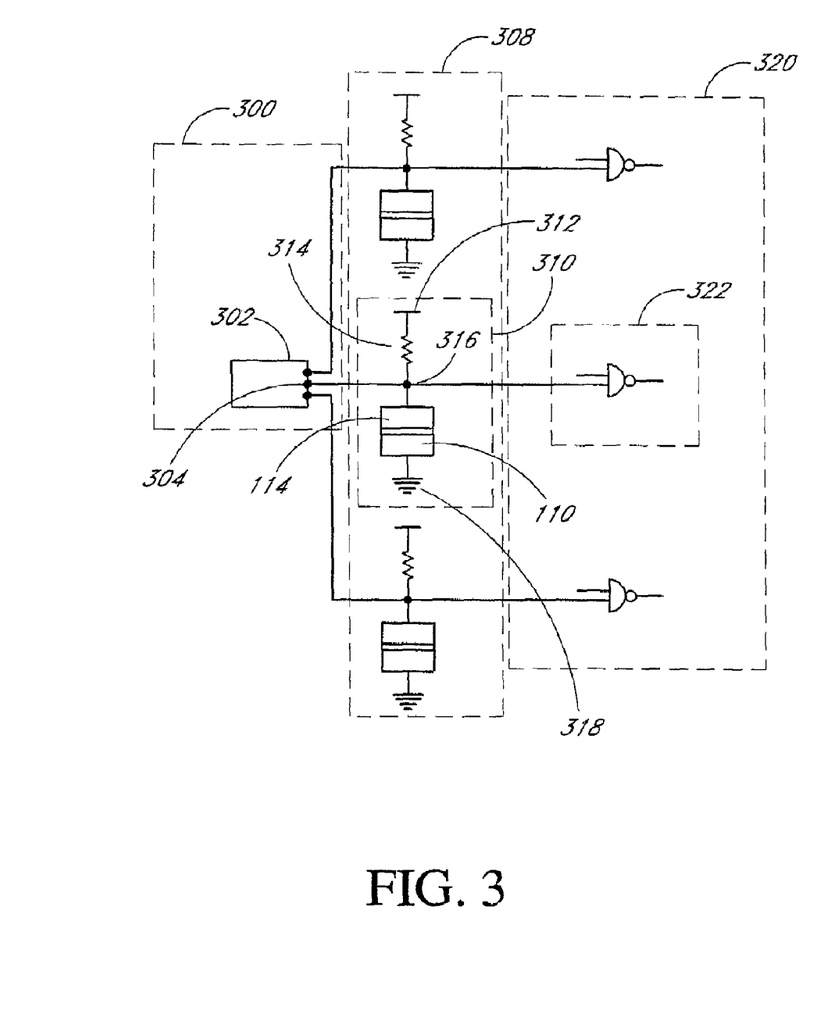
FIG. 3 is an electrical schematic incorporating a decoder circuit, an MTJ antifuse, and a logic block circuit.

FIG. 3 illustrates an exemplary circuit where the antifuse devices are used to selectively program components of the MRAM device as illustrated in FIGS. 2A, 2B. As previously described, antifuse elements may be permanently fused to produce a short circuit between components. The exact manner in which the antifuse devices 100 are connected to the various integrated circuit components of the MRAM device will, of course, vary depending on exact implementation of the MRAM circuit.

A first sub-circuit 300 illustrates, in this embodiment, a first schematic depicting a decoder circuit 302, wherein the decoder circuit 302 selectively isolates an individual antifuse circuit, such as an antifuse circuit 310, for a dielectric breakdown short to ground. The decoder circuit 302 has an output terminal 304. Generally, decoder circuits demultiplex input control data for single bit selection of addressed output, whereby a voltage potential in the form of a bit select is sent to the isolated node. In this particular embodiment, if the node 316 is selected by the decoder output terminal 304, a control voltage is sent to the antifuse 100 by way of the node 316.

A second sub-circuit 308 illustrates a second schematic depicting the antifuse sense circuit 310. A voltage supply 312 has an output terminal coupled to one end of a resistor 314, wherein the opposite end of the resistor 314 is coupled to the node 316. The output terminal 304 of the decoder circuit 302 and the soft layer 114 of the antifuse 100 are also coupled to the node 316 via the upper conductive trace 118 (FIG. 1A). Furthermore, the pinned layer 110 of the antifuse 100 is coupled to a ground contact point 318 via the lower conductive trace 106.

In one aspect, a control voltage, enabled by the decoder circuit 302, greater than 1.8 volts from the decoder output terminal 304 may be used to short the dielectric layer 112 of the antifuse 100 to the potential of ground via the ground contact point 318. If the dielectric layer 112 of the antifuse 100 is not shorted to the potential of the ground contact point 318, then the node 316 will be at the same voltage potential as the supply voltage 112. Otherwise, if the antifuse 100 is shorted to the ground contact point 318, then the node 316 will also be shorted to the ground contact point 318.

A third sub-circuit 320 illustrates a third schematic depicting a logic block circuit 322. Logic block circuits, in this embodiment, have numerous applications, wherein one application employs antifuse structures for use with test circuitry when sensing memory element states. Conventional testing of memory element states is traditionally performed by semiconductor based antifuse structures. In this particular embodiment, antifuse test elements are MTJ based antifuse structures, such as the antifuse 100. The logic block circuit 322 has a first input terminal 324, wherein the input terminal 324 of the logic block circuit 322 is coupled to the node 316 of second sub-circuit 308.

When the antifuse 100 is shorted to the ground contact point 318, voltage applied to the antifuse sense circuit 310 bypasses the logic block circuit 322 at the node 316 due to the short through antifuse 100 to ground contact point 318. Shorting the node 316 to ground forces a voltage bypass of logic block circuit 322, which disables the logic block input terminal 324 and, thus, disables logic block circuit 322. As a result, the antifuse 100, in this embodiment, is a permanent programmable short for disabling temporary logic circuits.

Thus, the decoder circuit 300 may be programmed so as to permit the selective application of the control voltage to the nodes 316 to selectively short the antifuse devices 100. As illustrated in FIG. 3, the array of antifuse devices may thus be selectively shorted by the decoder circuit 300. The shorted antifuse devices may thereby be used to affect the logical outcome of a logic circuit 320 to achieve a desired circuit configuration of the MRAM device or any other device that uses antifuse devices formed from MRAM materials in the manner described above.

From the foregoing, it will be appreciated that the MRAM based antifuse devices of the illustrated embodiment provide an antifuse device that may be selectively programmed at a lower voltage than previous antifuse devices. Advantageously, this improvement results in less likelihood of damage to other circuit components on the integrated circuit. Moreover, the MRAM based antifuse device does not require the use of the substrate which allows for greater density of circuits formed on the substrate. Additionally, there is also a significant improvement of processing efficiencies in forming the antifuse device of the illustrated embodiment, particularly when it is being formed simultaneously with the formation of an array of MRAM memory cells as the required additional processing steps to form the antifuse device are reduced.

Although the preferred embodiments of the present invention have shown, described, and pointed out the fundamental novel features of the invention as applied to those embodiments, it will be understood that various omissions, substitutions, and changes in the form of the detail of the device illustrated may be made by those skilled in the art without departing from the spirit of the present invention. Consequently, the scope of the invention should not be limited to the foregoing description but is to be defined by the appended claims.

What is claimed is:

1. A method of using MTJ MRAM devices to selectively affect the logical outcome of an integrated circuit, said method comprising the steps of:
    interconnecting the MTJ MRAM devices to an integrated circuit;
    selectively shorting one or more of the MTJ MRAM devices to affect the logical outcome of the integrated circuit, wherein selectively shorting one or more of the MTJ MRAM devices comprises selectively applying an electrical potential to one or more of the MTJ MRAM devices, wherein shorting one or more of the MTJ MRAM devices comprises connecting a first magnetic layer of the MTJ MRAM device to ground and applying an electrical potential to a second magnetic layer of the MTJ MRAM device to an electrical potential of approximately 1.8 volts or greater.

2. The method of claim 1, wherein the application of the electrical potential to the second magnetic layer results in the resistance of the MTJ MRAM device changing from approximately 1 MegaOhms to 10 KiloOhms.

3. The method of claim 1, wherein the integrated circuit comprises a memory circuit.

4. The method of claim 3, wherein the memory circuit comprises an array of MRAM devices.

5. The method of claim 4, wherein the MTJ MRAM device is formed at the periphery of the array of MRAM devices.

6. The method of claim 1, wherein the application of electrical potential to one or more of the MTJ MRAM devices is enabled by a decoder circuit.

7. The method of claim 1, wherein the application of electrical potential to the second magnetic layer changes the resistance of the MTJ MRAM device.

8. The method of claim 3, wherein the array of MRAM devices are configured in a cross-point configuration.

9. The method of claim 1, wherein the MTJ MRAM devices are used to test circuitry with sensing memory element states.

* * * * *